(12) United States Patent
Wu

(10) Patent No.: US 7,583,211 B1
(45) Date of Patent: Sep. 1, 2009

(54) ANALOG-TO-DIGITAL CONVERSION CIRCUIT

(75) Inventor: Honglei Wu, Sunnyvale, CA (US)

(73) Assignee: ZeroG Wireless, Inc., Sunnyvale, CA (US)

( * ) Notice: Subject to any disclaimer, the term of this patent is extended or adjusted under 35 U.S.C. 154(b) by 0 days.

(21) Appl. No.: 12/028,104

(22) Filed: Feb. 8, 2008

(51) Int. Cl.
*H03M 1/10* (2006.01)
(52) U.S. Cl. .................................. 341/120; 341/155
(58) Field of Classification Search ............... 341/120, 341/118, 119, 121, 155, 139
See application file for complete search history.

(56) References Cited

U.S. PATENT DOCUMENTS

| | | | |
|---|---|---|---|
| 4,336,525 A | 6/1982 | Chapple, III | |
| 5,028,926 A | 7/1991 | Tokuhiro | |
| 5,675,339 A * | 10/1997 | Andren et al. | 341/155 |
| 5,793,319 A * | 8/1998 | Ard | 341/120 |
| 6,633,247 B2 * | 10/2003 | Yakabe | 341/138 |
| 6,717,542 B2 * | 4/2004 | Harada | 341/161 |

OTHER PUBLICATIONS

Maxim Application Note 1080, Understanding SAR ADCs, http://www.maxim-ic.com/an1080, Mar. 1, 2001.

* cited by examiner

*Primary Examiner*—Brian Young
(74) *Attorney, Agent, or Firm*—The Mueller Law Office, P.C.

(57) ABSTRACT

An analog-to-digital conversion circuit and a method for calibrating an analog-to-digital conversion circuit are provided. A digital translation of an analog voltage is analyzed to determine a characteristic value of the analog voltage. A reference voltage, with which the digital translation is generated, is set to a value that is a minimum amount greater than the characteristic value. Additional embodiments include setting an offset voltage, with which the digital translation is also generated.

17 Claims, 4 Drawing Sheets

ANALOG-TO-DIGITAL CONVERSION CIRCUIT

BACKGROUND

An analog-to-digital conversion circuit converts an input analog voltage to a digital translation thereof. Since the input analog voltage typically varies with time, the analog-to-digital conversion circuit typically samples the input analog voltage at many points as time passes. At each sample point, an analog-to-digital-converter (ADC) within the analog-to-digital conversion circuit generates a set number of bits. These bits are a digital representation of the magnitude of the input analog voltage relative to a reference voltage (and sometimes also relative to an offset voltage). With the known values of the reference and offset voltages and the digital representation of the input analog voltage, the analog-to-digital conversion circuit generates the digital translation of the input analog voltage for each sample point.

The analog-to-digital conversion circuit generally provides a greater resolution, and thus measurement accuracy, of the input analog voltage with a greater number of sample points in a given time interval. The number of sample points in a given time interval is typically limited by how fast the analog-to-digital conversion circuit can generate the digital translation for each sample point. The analog-to-digital conversion circuit also provides greater accuracy with a greater number of bits (i.e. higher resolution) in the digital representations generated by the ADC. However, an ADC that generates more such bits generally takes more time to do so and/or takes up more physical space than an ADC that generates fewer such bits. The problem is, therefore, that there is generally a negative tradeoff between the desirable higher accuracy/resolution of the analog-to-digital conversion circuit and the undesirable slower speed and/or larger size and cost of the analog-to-digital conversion circuit.

DETAILED DESCRIPTION

Figure 1:
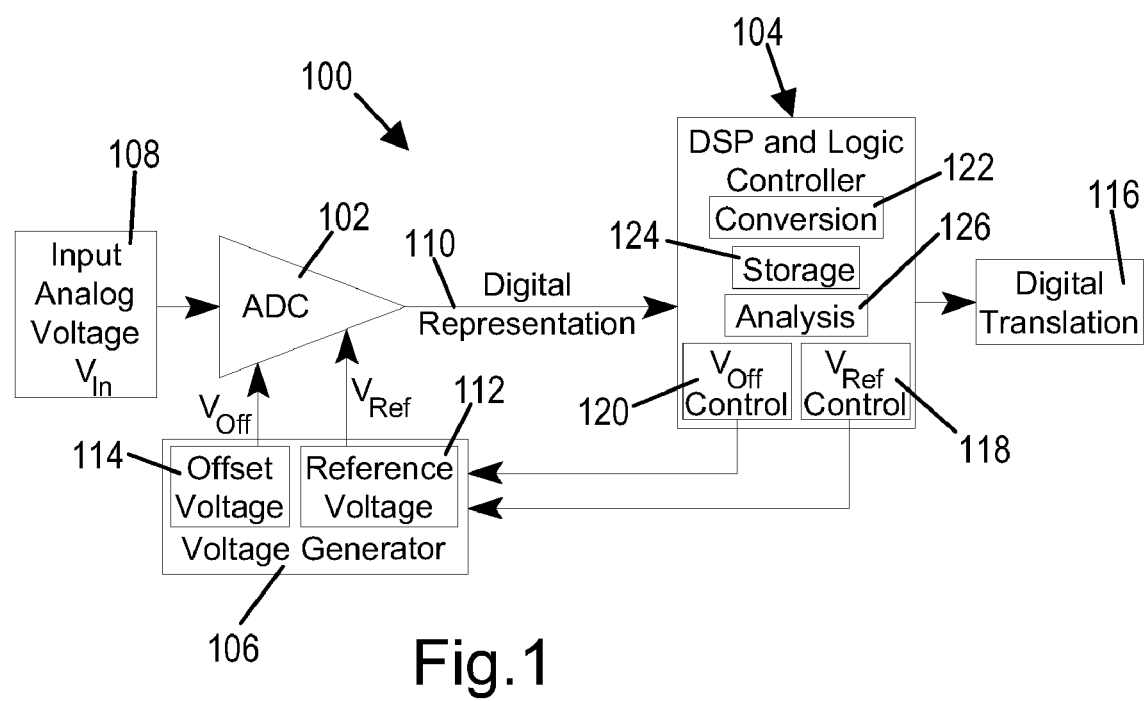
FIG. 1 is a simplified schematic diagram of an analog-to-digital conversion circuit according to an embodiment of the present invention.

An exemplary analog-to-digital conversion circuit 100 incorporating an embodiment of the present invention is shown in FIG. 1. The analog-to-digital conversion circuit 100 generally includes an ADC 102, a DSP (Digital Signal Processor) and logic controller 104 and a voltage generator 106. The ADC 102 receives an input analog voltage ($V_{In}$) 108 and generates a digital representation 110 thereof based on a reference voltage ($V_{Ref}$) 112 and an offset voltage ($V_{Off}$) 114. The reference voltage 112 and the offset voltage 114 are supplied by the voltage generator 106 under control of the logic controller 104. The logic controller 104 receives the digital representation 110 and generates a digital translation 116 of the input analog voltage 108 based on the digital representation 110 and known values for the reference voltage 112 and the offset voltage 114. Before the logic controller 104 begins to output the digital translations 116 for each sample point of the input analog voltage 108, however, the logic controller 104 analyzes the digital translation(s) 116 (or the digital representation(s) 110) to determine values at which to set the reference voltage 112 and the offset voltage 114.

The analog-to-digital conversion circuit 100 provides a solution to the problem described in the background due to the manner (described below) in which the values for the reference voltage 112 and the offset voltage 114 are set. Accordingly, the ADC 102 can generate an optimized set of bits for the digital representation 110 for each sample point of the input analog voltage 108. With this technique, therefore, the analog-to-digital conversion circuit 100 can generate the digital translation 116 with greater quality, accuracy and/or resolution than can a prior art circuit using the same quality ADC. Similarly, the analog-to-digital conversion circuit 100 can use a lower quality ADC 102 to generate the digital translation 116 with the same quality, accuracy and/or resolution than can a prior art circuit using a higher quality ADC.

According to various embodiments, in addition to receiving the digital representation 110 and outputting the digital translation 116, the logic controller 104 also outputs a reference voltage control signal 118 and an offset voltage control signal 120. These control signals 118 and 120 are supplied to the voltage generator 106. The voltage generator 106 generates the reference voltage 112 and the offset voltage 114 according to the reference and offset voltage control signals 118 and 120, respectively. The voltage generator 106 supplies the reference and offset voltages 112 and 114 to the ADC 102. (Some embodiments include only the reference voltage 112 and the reference voltage control signal 118 and not the offset voltage 114 or the offset voltage control signal 120.)

There are many types of ADCs that can be used for the ADC 102, such as successive-approximation-register (SAR) ADCs, pipelined ADCs, flash ADCs, etc. The ADC 102 may be an off-the-shelf type of product or a circuit specially designed for the particular application. The ADC 102 preferably has inputs for the reference and offset voltages 112 and 114, or just for the reference voltage 112. The ADC 102 uses the reference and offset voltages 112 and 114, or just the reference voltage 112, to generate the digital representation 110 periodically at each sample point of the input analog voltage 108. The ADC 102 supplies this data (i.e. the digital representations 110) to the logic controller 104.

The logic controller 104 generally performs conversion, storage and analysis functions as represented by functional blocks 122, 124 and 126, respectively. The functional blocks 122, 124 and 126 can be circuitry or software or both for performing these functions. Thus, the logic controller 104 can be an application-specific circuit designed specifically for the functions described herein or a general purpose microprocessor running software to perform these functions or a hybrid thereof.

According to some embodiments, the logic controller 104 converts (i.e. with the conversion functional block 122) the data (i.e. the digital representations 110) received from the ADC 102 for multiple sample points over a period of time based on the known values for the reference voltage 112 and the offset voltage 114 as set by the control signals 118 and 120. The logic controller 104 retains (i.e. with the storage functional block 124) this information so it can analyze (i.e. with the analysis functional block 126) the data. With this analysis, the logic controller 104 determines one or more characteristic values of the input analog voltage 108. Such characteristic values include a maximum magnitude value, a minimum magnitude value and a swing value (i.e. the difference between the maximum and minimum magnitude values) of the input analog voltage 108 during the period of time.

According to some embodiments, with the minimum magnitude value and the swing value, the logic controller 104 determines the values at which to set the reference voltage 112 and the offset voltage 114. According to other embodiments, with just the maximum magnitude value, the logic controller 104 determines the value at which to set the reference voltage 112. Additionally, the logic controller 104 may repeat some or all of these functions in order to hone in on optimal values for the reference voltage 112 and the offset voltage 114 or just for the reference voltage 112. Preferably, the offset voltage 114 is set at a minimum amount below the minimum magnitude value of the input analog voltage 108, and the reference voltage 112 is set at a minimum amount greater than the swing value. For embodiments that do not include setting the offset voltage 114, the reference voltage 112 is set at a minimum amount above the maximum magnitude value of the input analog voltage 108. The minimum amounts at which the reference and offset voltages 112 and 114 are set below, greater than or above the characteristic values of the input analog voltage 108 preferably account for potential variations in the minimum and maximum magnitude values of the input analog voltage 108 that may arise during operation of the analog-to-digital conversion circuit 100.

After the logic controller 104 sets the reference and offset voltages 112 and 114 or just the reference voltage 112, the logic controller 104 begins to output the digital translations 116 for subsequent sample points of the input analog voltage 108. Additionally, the logic controller 104 may repeat the setting of the reference and offset voltages 112 and 114, or just the reference voltage 112, each time the analog-to-digital conversion circuit 100 is powered on. The logic controller 104 may also reset these voltages 112 and 114, or just 112, at various times or at predetermined intervals. Such resetting may be necessary because conditions under which the analog-to-digital conversion circuit 100 operates or the input analog voltage 108 is generated may change, thereby changing the characteristic values of the input analog voltage 108.

The logic controller 104 may also monitor the digital representations 110 output by the ADC 102 or the digital translations 116 generated by the logic controller 104 for values that match or exceed the range allowed by the reference and offset voltages 112 and 114. In such cases, the logic controller 104 preferably resets the reference and offset voltages 112 and 114 in order to keep the digital representations 110 and the digital translations 116 within an allowable range defined by the reference and offset voltages 112 and 114.

Figure 2:
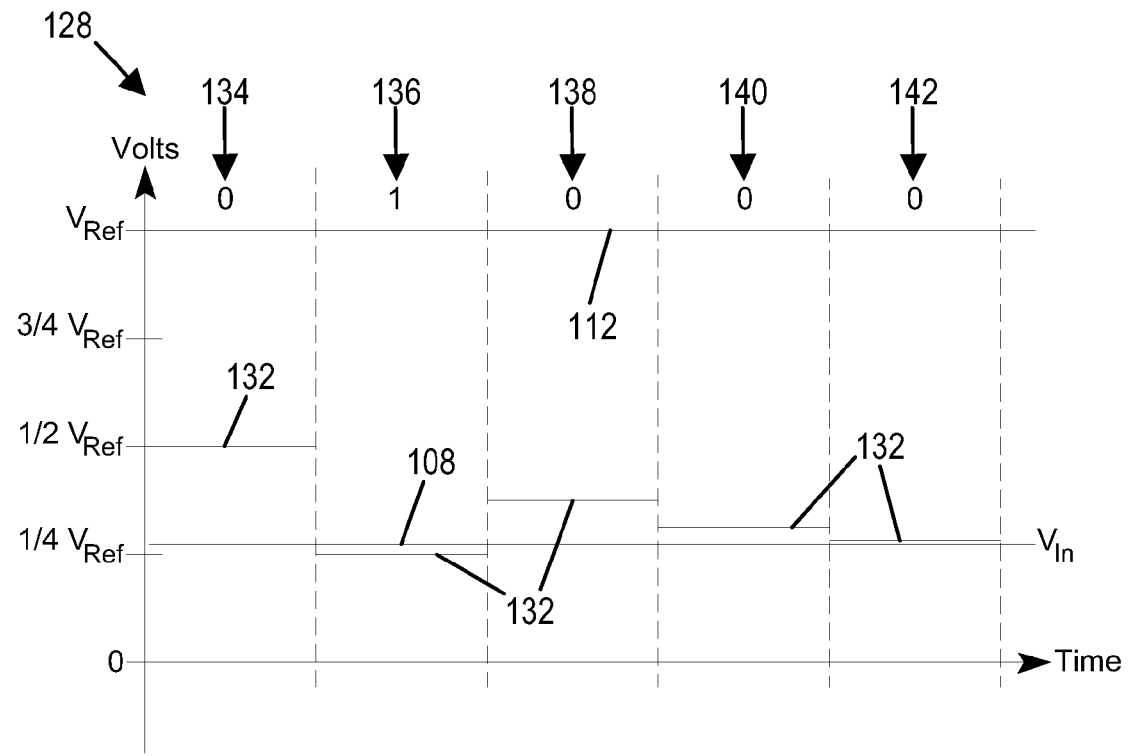
FIG. 2 is a simplified graph illustrating the function of an exemplary ADC for use in the analog-to-digital conversion circuit shown in FIG. 1 according to an embodiment of the present invention.
Figure 3:
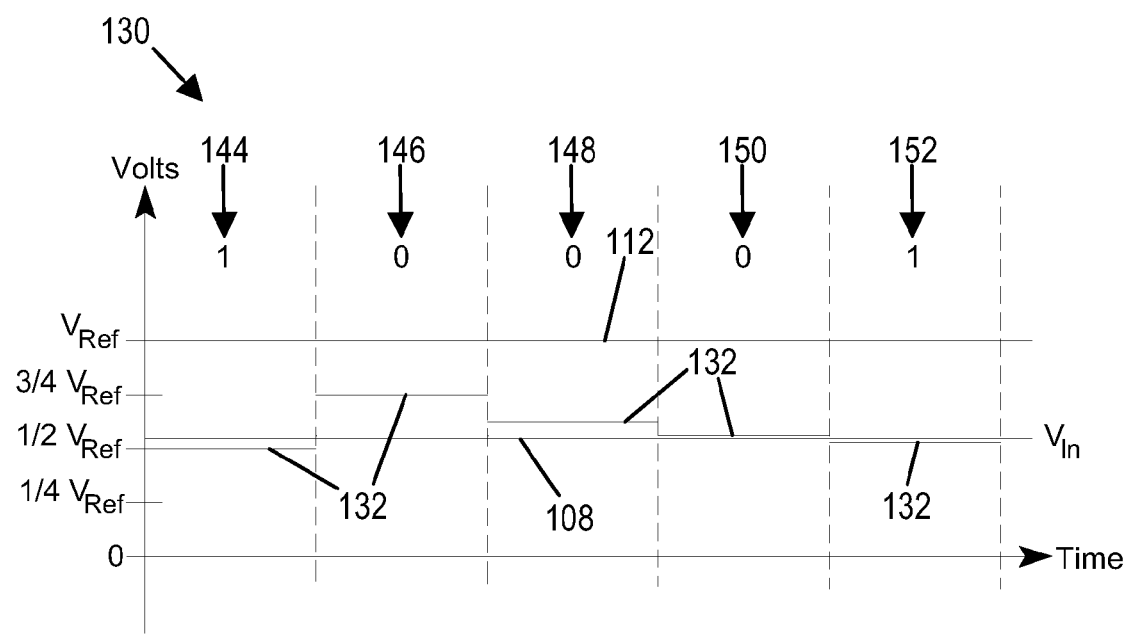
FIG. 3 is another simplified graph illustrating the function of an exemplary ADC for use in the analog-to-digital conversion circuit shown in FIG. 1 according to an embodiment of the present invention.

A voltage versus time graph 128 shown in FIG. 2 illustrates the function of the ADC 102 in a situation in which the reference voltage ($V_{Ref}$) 112 is considerably greater than the input analog voltage ($V_{In}$) 108. On the other hand, another voltage versus time graph 130 shown in FIG. 3 illustrates the function of the ADC 102 in a situation in which the reference voltage 112 is relatively closer to the input analog voltage 108. For both examples, the offset voltage 114 is assumed to be zero volts. (For simplified illustrative purposes, both graphs 128 and 130 assume a 5-bit SAR ADC, but it is understood that the invention is not so limited.) A comparison of the results of these two graphs 128 and 130 illustrates the advantage of having the reference voltage 112 relatively closer to the input analog voltage 108.

To generate each bit 134, 136, 138, 140 and 142 of the digital representation 110 (FIG. 1), the ADC 102 will set a comparison voltage 132 for each bit 134-142 and compare it to the input analog voltage 108. Beginning with the example in the FIG. 2, for each bit 134-142, each time the comparison voltage 132 is greater than the input analog voltage 108, the corresponding bit is set to zero. (See bits 134 and 138-142.) Alternatively, each time the comparison voltage 132 is less than the input analog voltage 108, the corresponding bit is set to one. (See bit 136.) The ADC 102 sets the first comparison voltage 132 for the first bit 134 to one half of the reference voltage 112. The comparison voltage 132 is changed (up or down) by one fourth of the reference voltage 112 for the second bit 136, depending on the result of the first comparison. The comparison voltage 132 is changed (up or down) for each successive bit 138, 140 and 142 by one half of the amount of the previous change to the comparison voltage 132, depending on the result of the previous comparison. For each bit 136-142 after the first bit 134, the comparison voltage 132 is changed down when the previous bit (e.g. 134, 138 and 140) is zero, and the comparison voltage 132 is changed up when the previous bit (e.g. 136) is one. For the example in FIG. 2, the digital representation 110 of the input analog voltage 108 is 01000.

For the example in FIG. 3, the input analog voltage 180 is assumed to be the same as that for the example in FIG. 2. The reference voltage 112 in FIG. 3, however, is about half of the reference voltage 112 for the example in FIG. 2. The reference voltage 112 in FIG. 3 is thus much closer to, although still larger than, the input analog voltage 180 than is the reference voltage 112 in FIG. 2. To generate each bit 144, 146, 148, 150 and 152 of the digital representation 110 (FIG. 1), the ADC 102 again will set a comparison voltage 132 for each bit 144-152 and compare it to the input analog voltage 108, as described above. For the example in FIG. 3, therefore, the digital representation 110 of the input analog voltage 108 is 10001.

It can be seen from the results of these two examples that an additional significant bit is obtained by the example in FIG. 3. Therefore, it follows that the logic controller 104 (FIG. 1) would be able to produce a better (e.g., higher quality, accuracy and/or resolution) digital translation 116 using a reference voltage 112 that is closer to the input analog voltage 108, even though the ADC 102 is of the same quality in both examples.

Figure 4:
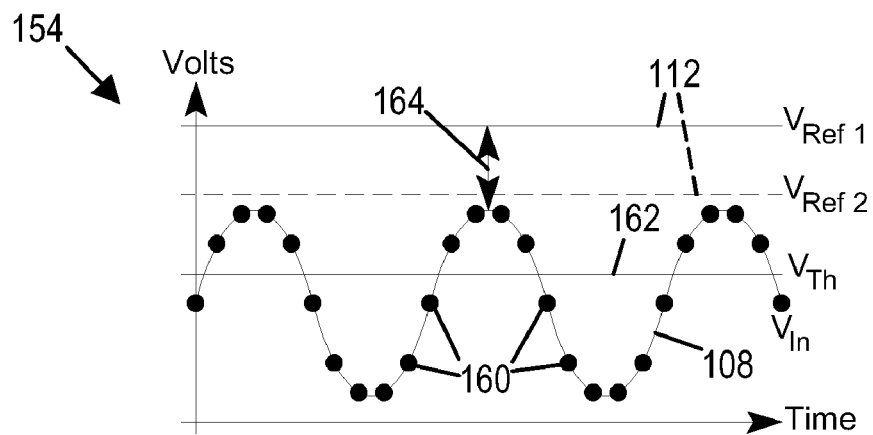
FIG. 4 is a simplified graph illustrating a function of the analog-to-digital conversion circuit shown in FIG. 1 according to an embodiment of the present invention.
Figure 5:
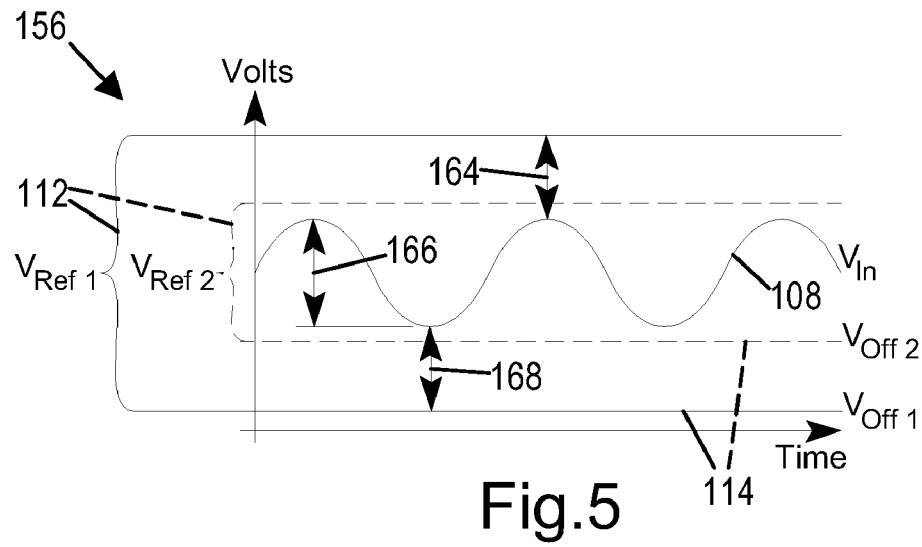
FIG. 5 is another simplified graph illustrating another function of the analog-to-digital conversion circuit shown in FIG. 1 according to an embodiment of the present invention.
Figure 6:
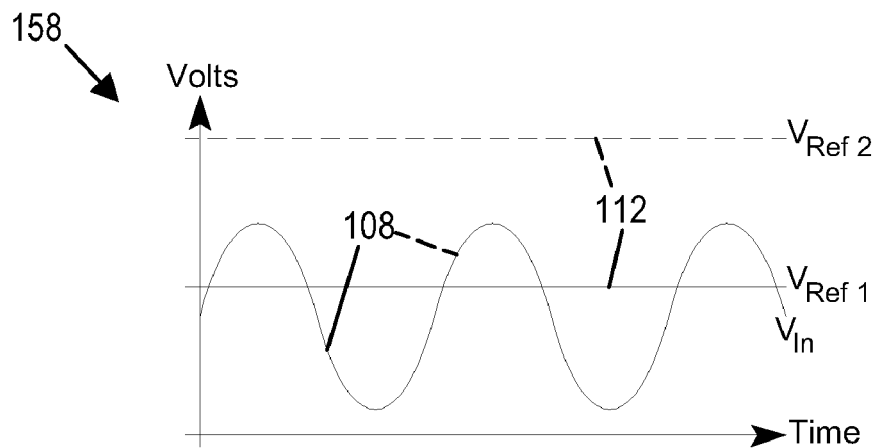
FIG. 6 is yet another simplified graph illustrating yet another function of the analog-to-digital conversion circuit shown in FIG. 1 according to an embodiment of the present invention.

Exemplary situations illustrated by graphs 154, 156 and 158 shown in FIGS. 4, 5 and 6, respectively, demonstrate functions of the analog-to-digital conversion circuit 100 according to some embodiments of the present intention. The voltage versus time graphs 154, 156 and 158 show exemplary waveforms for the input analog voltage 108. For simplicity in each case, the waveform is shown as a simple, regular sine wave. However, it is understood that the invention is not limited to operating only with such waveforms, but applies also to waveforms of variable and irregular shapes, including those having variable frequencies and amplitudes. The example shown in FIG. 4 illustrates a situation in which only the reference voltage 112, and not the offset voltage 114, can be set by the logic controller 104 (FIG. 1). The example shown in FIG. 5 illustrates a situation in which both the reference voltage 112 and the offset voltage 114 can be set. Exemplary sample points 160 are also shown on the waveform for the input analog voltage 108 in FIG. 4.

The initial value for the reference voltage ($V_{Ref\,1}$) 112, as shown in FIG. 4, is preferably set to be greater than the input analog voltage 108. However, the maximum magnitude value for the input analog voltage 180 is unknown initially. Therefore, a threshold voltage 162 may be used to perform a "coarse" reduction adjustment of the reference voltage 112 if the reference voltage 112 is initially set too high. The threshold voltage 162 is preferably selected to be substantially lower than the reference voltage 112. For example, a value for the threshold voltage 162 of 50% of the reference voltage 112 may be appropriate, but other values for, or methods of determining, the threshold voltage 162 may be used, depending on the application.

Since the threshold voltage 162 is selected to be substantially lower than the reference voltage 112, if the input analog voltage 108 is below the threshold voltage 162, then the determination of the value of any sample point 160 will be of relatively low quality or accuracy, as explained with reference to FIGS. 2 and 3 above. In such a case, it may be preferable in some applications to perform a coarse reduction adjustment of the reference voltage 112 and then take new sample points 160, which will be of a relatively higher quality or accuracy. Therefore, after taking a number of sample points 160 for an appropriate period of time, if the maximum magnitude value for the input analog voltage 108 is less than the threshold voltage 162, then the reference voltage 112 is reduced to be slightly higher than the maximum magnitude value. Then a more "fine" adjustment of the reference voltage 112 may be performed using sample points 160 of a better quality or accuracy.

Once the maximum magnitude value of the input analog voltage 108 is determined to be between the reference voltage ($V_{Ref\,1}$) 112 and the threshold voltage 162, as shown in FIG. 4, a final setting for the reference voltage ($V_{Ref\,2}$) 112 may be made. In this manner, a difference 164 between the maximum magnitude value and the reference voltage 112 is minimized or optimized, so the quality, accuracy and/or resolution of the digital translations 116 (FIG. 1) are optimized. According to other embodiments that do not incorporate the threshold voltage 162, however, the final setting for the reference voltage 112 may simply be made once the maximum magnitude value of the input analog voltage 108 has been found to be below the reference voltage 112. On the other hand, still other embodiments that do not incorporate the threshold voltage 162 may perform an initial reduction adjustment of the reference voltage 112 closer to the maximum magnitude value, followed by a second (finer) adjustment of the reference voltage 112 that minimizes the difference 164.

In the example of FIG. 5, since both the reference voltage 112 and the offset voltage 114 can be set, the reference voltage 112 is more clearly understood as being a "range" above the offset voltage 114. The reference voltage 112 (i.e. the "input range") is preferably set to be a minimum amount greater than the swing value 166 (the difference between the maximum and minimum magnitude values) of the input analog voltage 108.

Initially, since the actual range of the input analog voltage 108 is unknown, the offset voltage ($V_{Off\,1}$) 114 is set relatively low, and the reference voltage ($V_{Ref\,1}$) 112 is set relatively high. Adjustments to the reference voltage 112 may be made as described above with reference to FIG. 4. As another option, similar initial adjustments to the offset voltage 114 may also be made to bring the offset voltage 114 closer to the minimum magnitude value of the input analog voltage 108 prior to making the final setting of the offset voltage 114. Therefore, after taking sample points for a period of time and making any proper initial coarse adjustments and taking any necessary additional sample points, the final setting of the offset voltage ($V_{Off\,2}$) 114 is made to minimize or optimize the amount of the difference 168 between the offset voltage 114 and the minimum magnitude value of the input analog voltage 108. Similarly, the final setting of the reference voltage ($V_{Ref\,2}$) 112 is made to minimize or optimize the difference 164 between the maximum magnitude value of the input analog voltage 108 and the reference voltage 112.

The example shown in FIG. 6 illustrates a situation in which the initial setting for the reference voltage ($V_{Ref\,1}$) 112 is too low. In such a case, the part of the waveform of the input analog voltage 108 (shown in dashed lines) above the reference voltage ($V_{Ref\,1}$) 112 will not be properly determined by the analog-to-digital conversion circuit 100. Instead, this part of the waveform will appear to be a flat line at the same magnitude as the reference voltage ($V_{Ref\,1}$) 112. Therefore, according to some embodiments, an analysis that shows any of the sample points to be the same as, or simply too close to, the reference voltage ($V_{Ref\,1}$) 112 preferably results in an adjustment to the reference voltage ($V_{Ref\,1}$) 112 to an increased value ($V_{Ref\,2}$). The amount of the increase may be any appropriate level, such as a predetermined percentage of the reference voltage ($V_{Ref\,1}$) 112, depending on the application. If an additional analysis of additional sample points gets similar results, then another such adjustment may be made and repeated until the maximum magnitude value of the input analog voltage 108 is less than the reference voltage ($V_{Ref\,2}$) 112. (Similar analyses and adjustments may be made for the offset voltage 114 if any part of the waveform of the input analog voltage 108 is the same as, or simply too close to, the offset voltage 114.) Then further adjustments may be made as described above with reference to FIGS. 4 and 5.

Figure 7:
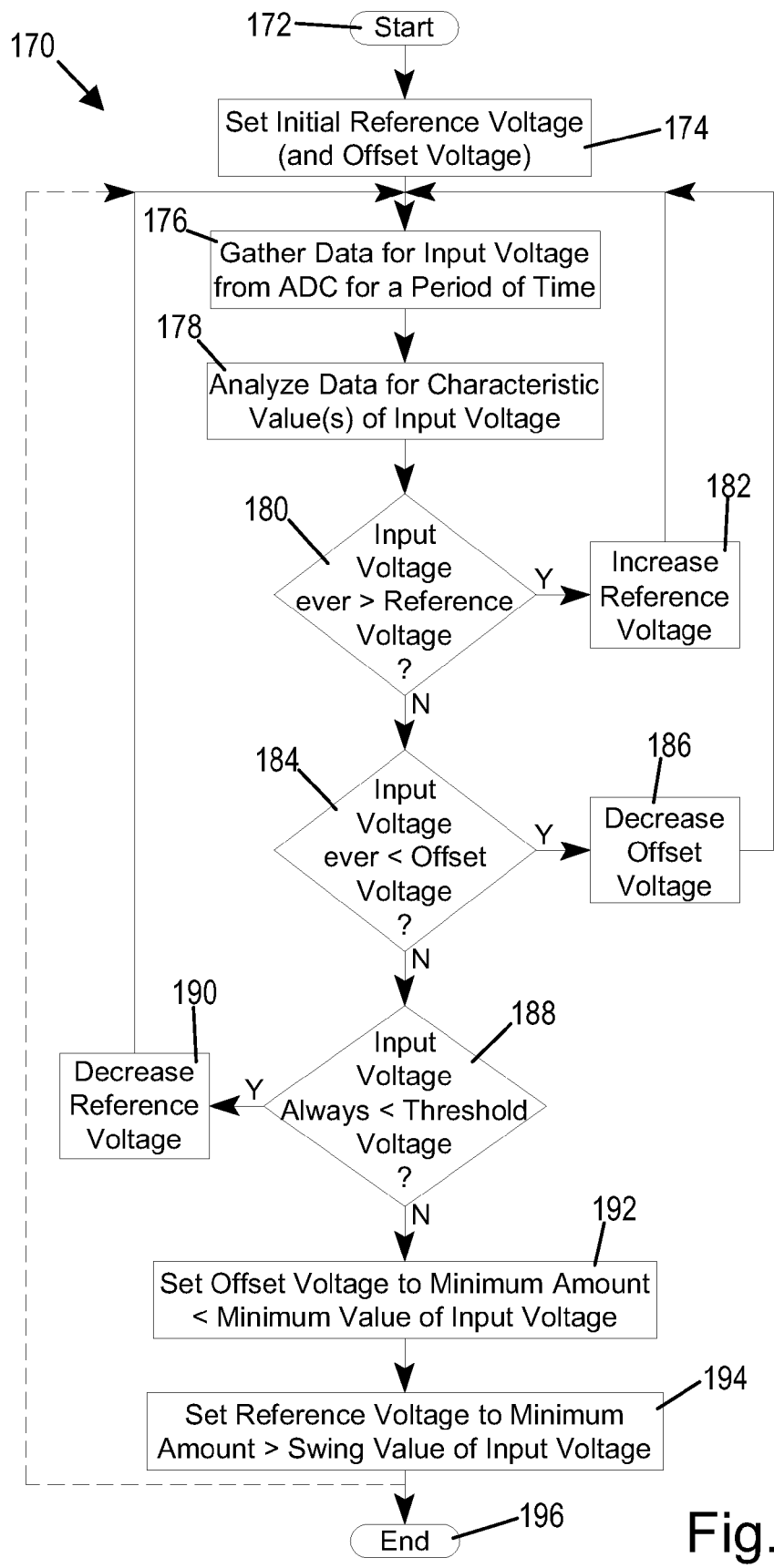
FIG. 7 is a simplified flowchart for an exemplary method that is consistent with an embodiment of the present invention.

In accordance with some embodiments, an exemplary method 170 for the analog-to-digital conversion circuit 100 to set the reference and offset voltages 112 and 114 is shown in FIG. 7. (Other embodiments may use other appropriate methods to set the reference and offset voltages 112 and 114 with minimum differences 164 and 168. See FIGS. 4 and 5.) Upon starting (at 172), initial values are set (at 174) for the reference and offset voltages 112 and 114. (This embodiment assumes that both the reference voltage 112 and the offset voltage 114 can be set. Other embodiments may only set the reference voltage 112.) Data for sample points of the input analog voltage 108 is then gathered (at 176) for a period of time from the ADC 102 (FIG. 1) by the logic controller 104. Such data gathering is described above with reference to the functional blocks 122 and 124. The data is then analyzed (at 178) to determine the characteristic values (e.g. maximum and minimum magnitude values and swing value) of the input analog voltage 108. Such analysis is described above with reference to the analysis functional block 126. At 180, it is determined whether the input analog voltage 108 is ever greater than the reference voltage 112 (i.e. whether the maximum magnitude value is ever the same as, or too close to, the reference voltage 112). If so, the reference voltage 112 is increased (at 182), as described above, and the method 170 returns to 176. If the determination at 180 is negative, then it is determined (at 184) whether the input analog voltage 108 is ever less than the offset voltage 114 (i.e. whether the minimum magnitude value is ever the same as, or too close to, the offset voltage 114). If so, the offset voltage 114 is decreased (at 186) and the method 170 returns to 176. If the determination at 184 is negative, then it is determined (at 188) whether the input analog voltage 108 (i.e. the maximum magnitude value) is always less than the threshold voltage 162 (FIG. 4). If so, then the reference voltage 112 is decreased (at 190), as described above with reference to FIG. 4, and the method 170 returns to 176. If the determination at 188 is negative, then the final value for the offset voltage 114 is set (at 192) at a minimum amount less than the minimum magnitude value of the input analog voltage 108. Additionally, the final value for the reference voltage 112 is set (at 194) at a minimum amount greater than the swing value of the input analog voltage 108. The method 170 then either ends (at 196) or returns to 176 to ensure that the reference and offset voltages 112 and 114 remain at appropriate values. The return to 176 may be done periodically or at appropriate times, as mentioned above.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention, which is more particularly set forth in the appended claims. Furthermore, those of ordinary skill in the art will appreciate that the foregoing description is by way of example only, and is not intended to limit the invention. Thus, it is intended that the present subject matter covers such modifications and variations as come within the scope of the appended claims and their equivalents.

What is claimed is:

1. A method for calibrating an analog-to-digital conversion circuit, comprising:
   analyzing a digital translation of an analog voltage to determine a swing value of the analog voltage and a minimum magnitude of the analog voltage;
   setting a reference voltage, with which the digital translation is generated, to a value that is a minimum amount greater than the characteristic value; and
   setting an offset voltage, with which the digital translation is also generated, to a value that is a minimum amount below the minimum magnitude of the analog voltage.

2. The method of claim 1, further comprising:
   analyzing the digital translation of the analog voltage for a period of time to determine the minimum magnitude and the swing value of the analog voltage.

3. The method of claim 2, further comprising:
   analyzing the digital translation of the analog voltage for the period of time to determine whether the analog voltage during the period of time is ever greater than the reference voltage; and
   if so, increasing the reference voltage and repeating the method before setting the reference voltage to the value that is the minimum amount greater than the swing value and before setting the offset voltage to the value that is the minimum amount below the minimum magnitude.

4. The method of claim 2, further comprising:
   analyzing the digital translation of the analog voltage for the period of time to determine whether the analog voltage during the period of time is always less than a threshold voltage; and
   if so, decreasing the reference voltage and repeating the method before setting the reference voltage to the value that is the minimum amount greater than the swing value and before setting the offset voltage to the value that is the minimum amount below the minimum magnitude.

5. A method for calibrating an analog-to-digital conversion circuit, comprising:
   analyzing a digital translation of an analog voltage to determine is a maximum magnitude of the analog voltage; and
   setting a reference voltage, with which the digital translation is generated, to a value that is a minimum amount above the maximum magnitude.

6. The method of claim 5, wherein:
   the analyzing further comprises analyzing the digital translation of the analog voltage for a period of time to determine the maximum magnitude of the analog voltage during the period of time.

7. The method of claim 6, further comprising:
   analyzing the digital translation of the analog voltage for the period of time to determine whether the analog voltage during the period of time is ever greater than the reference voltage; and
   if so, increasing the reference voltage and repeating the method before setting the reference voltage to the value that is the minimum amount above the maximum magnitude.

8. The method of claim 6, further comprising:
   analyzing the digital translation of the analog voltage for the period of time to determine whether the analog voltage during the period of time is always less than a threshold voltage; and
   if so, decreasing the reference voltage and repeating the method before setting the reference voltage to the value that is the minimum amount above the maximum magnitude.

9. An analog-to-digital conversion circuit for converting an input voltage to a digital translation thereof, comprising:
   an ADC that receives the input voltage, a reference voltage and an offset voltage and that outputs a
   digital representation of the input voltage based on the reference voltage and the offset voltage, the input voltage being characterized by a swing value and a minimum value; and
   a controller that receives and analyzes the digital representation of the input voltage to determine the swing value and the minimum value thereof and that
   sets the offset voltage to be a minimum amount below the minimum value of the input voltage and sets the reference voltage to be the minimum amount greater than the swing value of the input voltage.

10. The analog-to-digital conversion circuit of claim 9, wherein:
    the controller analyzes the digital representation of the input voltage for a period of time to determine the minimum and swing values of the input voltage before setting the offset voltage to be the minimum amount below the minimum value of the input voltage and before setting the reference voltage to be the minimum amount greater than the swing value of the input voltage.

11. The analog-to-digital conversion circuit of claim 10, wherein:
    the controller analyzes the digital representation of the input voltage for the period of time to determine whether the input voltage during the period of time is ever greater than the reference voltage and, if so, increases the reference voltage and repeats the analysis before setting the offset voltage to be the minimum amount below the minimum value of the input voltage and before setting the reference voltage to be the minimum amount greater than the swing value of the input voltage.

12. The analog-to-digital conversion circuit of claim 10, wherein:

the controller analyzes the digital representation of the input voltage for the period of time to determine whether the input voltage during the period of time is always less than a threshold voltage and, if so, decreases the reference voltage and repeats the analysis before setting the offset voltage to be the minimum amount below the minimum value of the input voltage and before setting the reference voltage to be the minimum amount greater than the swing value of the input voltage.

13. An analog-to-digital conversion circuit for converting an input voltage to a digital translation thereof, comprising:

an ADC that receives the input voltage and a reference voltage and that outputs a digital representation of the input voltage based on the reference voltage, the input voltage being characterized by a maximum value thereof; and a controller that receives and analyzes the digital representation of the input voltage to determine the maximum value thereof and that sets the reference voltage to be a minimum amount greater than the maximum value of the input voltage.

14. The analog-to-digital conversion circuit of claim 13, wherein:

the controller analyzes the digital representation of the input voltage for a period of time to determine the maximum value of the input voltage before setting the reference voltage.

15. The analog-to-digital conversion circuit of claim 14, wherein:

the controller analyzes the digital representation of the input voltage for the period of time to determine whether the input voltage during the period of time is ever greater than the reference voltage and, if so, increases the reference voltage and repeats the analysis before setting the reference voltage to be the minimum amount greater than the maximum value of the input voltage.

16. The analog-to-digital conversion circuit of claim 14, wherein:

the controller analyzes the digital representation of the input voltage for the period of time to determine whether the input voltage during the period of time is always less than a threshold voltage and, if so, decreases the reference voltage and repeats the analysis before setting the reference voltage to be the minimum amount greater than the maximum value of the input voltage.

17. An analog-to-digital conversion circuit for converting an input voltage to a digital translation thereof, comprising:

a means for generating a digital representation of the input voltage based on a reference voltage and an offset voltage, the input voltage being characterized by a swing value and a minimum value;

a means for analyzing the digital representation of the input voltage to determine the swing value and the minimum value thereof; and a means for setting the offset voltage to be a minimum amount below the minimum value of the input voltage and setting the reference voltage to be a minimum amount greater than the swing value of the input voltage.

\* \* \* \* \*